(12) United States Patent
Kato et al.

(10) Patent No.: US 8,461,463 B2
(45) Date of Patent: Jun. 11, 2013

(54) COMPOSITE MODULE

(75) Inventors: Noboru Kato, Nagaokakyo (JP); Jun Sasaki, Nagaokakyo (JP); Katsumi Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 56 days.

(21) Appl. No.: 13/080,783

(22) Filed: Apr. 6, 2011

(65) Prior Publication Data
US 2011/0182039 A1 Jul. 28, 2011

Related U.S. Application Data

(63) Continuation of application No. PCT/JP2009/067161, filed on Oct. 1, 2009.

(30) Foreign Application Priority Data

Oct. 8, 2008 (JP) ................................ 2008-261849

(51) Int. Cl.
*H05K 1/16* (2006.01)

(52) U.S. Cl.
USPC .......... 174/260; 174/258; 174/264; 174/263; 361/736; 361/761; 361/763

(58) Field of Classification Search
USPC ................... 361/736, 761, 763; 174/264, 263
See application file for complete search history.

(56) References Cited

U.S. PATENT DOCUMENTS

| 2004/0120127 | A1 | 6/2004 | Hirose | |
| 2004/0211590 | A1* | 10/2004 | Tagi et al. | 174/255 |
| 2005/0018382 | A1* | 1/2005 | Takazawa | 361/321.2 |
| 2007/0030628 | A1* | 2/2007 | Yamamoto et al. | 361/311 |
| 2007/0121273 | A1* | 5/2007 | Yamamoto et al. | 361/306.2 |
| 2009/0266594 | A1* | 10/2009 | Yoshikawa | 174/260 |

FOREIGN PATENT DOCUMENTS

| JP | 2003-212648 A | 7/2003 |
| JP | 2004-193404 A | 7/2004 |
| JP | 2004-356264 A | 12/2004 |
| JP | 2005-203633 A | 7/2005 |
| JP | 2007-173713 A | 7/2007 |
| JP | 2007-281160 A | 10/2007 |
| JP | 2008-270386 A | 11/2008 |
| WO | 2005/101934 A1 | 10/2005 |

OTHER PUBLICATIONS

Official Communication issued in International Patent Application No. PCT/JP2009/067161, mailed on Nov. 17, 2009.

* cited by examiner

*Primary Examiner* — Tuan T Dinh
*Assistant Examiner* — Steven Sawyer
(74) *Attorney, Agent, or Firm* — Keating & Bennett, LLP

(57) ABSTRACT

A composite module is obtained which enables high-density mounting of components without increasing its size. A composite module includes a main substrate which is a multilayer circuit board, a sub-substrate mounted on a lower surface of the main substrate, a sealing layer arranged on the lower surface of the main substrate to cover the sub-substrate, the sealing layer defining a mount surface arranged to be mounted on a mount board, and terminal electrodes disposed on the mount surface. The terminal electrodes include at least one first terminal electrode drawn directly from the main substrate and at least one second terminal electrode drawn directly from the sub-substrate.

10 Claims, 3 Drawing Sheets

COMPOSITE MODULE

BACKGROUND OF THE INVENTION

1. Field of the Invention

The present invention relates to composite modules and, particularly, to a composite module, such as a DC-DC converter, which includes a multilayer circuit board that defines a main substrate and includes a principal surface on which functional elements, such as semiconductor devices and capacitors, are mounted.

2. Description of the Related Art

Japanese Unexamined Patent Application Publication No. 2007-281160 describes a composite module which includes a multilayer circuit board that defines a base and includes a principal surface on which functional elements, such as a semiconductor device and a capacitor, are mounted and covered with a resin member. The resin member is provided with holes that are formed by a laser or other suitable method to extend to the multilayer circuit board. The holes are filled with electrode paste to form via-hole conductors, which are connected at one end to input/output terminals on a surface of the resin member. Thus, a compact composite module can be obtained in which functional elements are mounted on both principal surfaces of the multilayer circuit board.

This composite module enables a plurality of functional elements to be mounted on both principal surfaces of the multilayer circuit board. However, when the number of surface mount devices, such as capacitors and inductors, on the multilayer circuit board increases, a required number of via-hole conductors cannot be formed in the resin member without increasing the area of the multilayer circuit board. As a result, the size of the composite module itself is increased. Avoiding such a size increase would require a reduction in the number of via-hole conductors. However, reducing the number of via-hole conductors makes it difficult to enable a large number of components to be mounted on the multilayer circuit board. In other words, since it has been difficult to achieve both high-density mounting of components and size reduction, it has been necessary to sacrifice one of high-density mounting of components or size reduction.

SUMMARY OF THE INVENTION

To overcome the problems described above, preferred embodiments of the present invention provide a composite module which enables high-density mounting of components without increasing the size thereof.

A composite module according to a preferred embodiment of the present invention preferably includes a main substrate, a sub-substrate mounted on one principal surface of the main substrate, a sealing layer arranged on the one principal surface of the main substrate to at least partially cover the sub-substrate, the sealing layer defining a mount surface arranged to be mounted on a mount board, and terminal electrodes disposed on the mount surface and arranged to be connected to the mount board. The terminal electrodes preferably include at least one first terminal electrode drawn directly from the main substrate and at least one second terminal electrodes drawn directly from the sub-substrate.

The composite module preferably includes not only the first terminal electrodes drawn directly from the main substrate, but also the second terminal electrodes drawn directly from the sub-substrate mounted on one principal surface of the main substrate. Therefore, even if the number of components mounted on the main substrate increases, it is possible to increase the number of necessary terminal electrodes without increasing the size of the main substrate.

That is, in the composite module according to preferred embodiments of the present invention, the sub-substrate is a special-purpose component, not a general-purpose component. The second terminal electrodes are preferably disposed on the sub-substrate, with the electrodes interposed between the sub-substrate and the second terminal electrodes. Alternatively, the electrodes on the sub-substrate are preferably used as the second terminal electrodes.

In the composite module according to preferred embodiments of the present invention, it is possible to achieve high-density mounting on the main substrate without increasing the size of the main substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of a composite module according to the present invention will be described with reference to the attached drawings. Note that components and parts which are common throughout the drawings are denoted by the same reference symbols, and redundant description will be omitted.

First Preferred Embodiment

Figure 1:
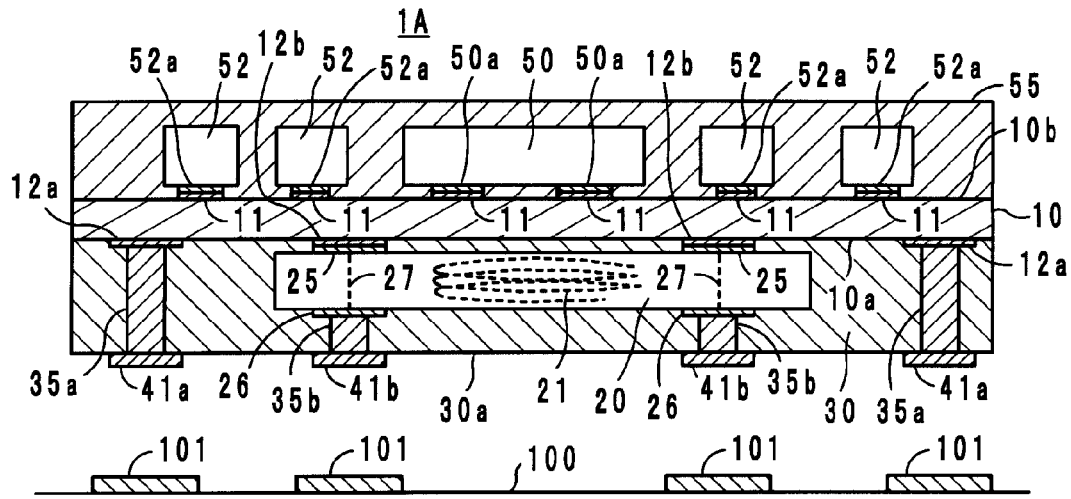
FIG. 1 is a cross-sectional view of a composite module according to a first preferred embodiment of the present invention.

FIG. 1 illustrates a composite module 1A according to a first preferred embodiment of the present invention. The composite module 1A is preferably mounted on a mount board 100 included, for example, in a mobile phone. The composite module 1A includes a main substrate 10, a sub-substrate 20 mounted on a lower surface 10a which is one principal surface of the main substrate 10, a sealing layer 30 disposed on the lower surface 10a of the main substrate 10 such that it includes and covers the sub-substrate 20, and first terminal electrodes 41a and second terminal electrodes 41b disposed on a lower surface (hereinafter referred to as a mount surface 30a) of the sealing layer 30. An IC chip 50 and chip components 52, such as inductors and capacitors, for example, are mounted on an upper surface 10b, which is the other principal surface of the main substrate 10, and covered with a sealing layer 55.

The main substrate 10 is preferably a multilayer circuit board made of a low-temperature fired ceramic, for example. The main substrate 10 includes internal electrodes (not shown), which are connected to electrodes 11, first connection electrodes 12a, and second connection electrodes 12b provided on the upper and lower surfaces of the main substrate 10. The electrodes 11 are preferably connected by solder, for example, to electrodes 50a on the IC chip 50 and electrodes 52a on the chip components 52.

The sub-substrate 20 is preferably a multilayer magnetic substrate or a multilayer dielectric substrate, for example, having a dielectric constant greater than that of the main substrate 10. The sub-substrate 20 is preferably internally provided with, for example, a coil-shaped inductor 21. The sub-substrate 20 includes electrodes 25 on an upper surface thereof and electrodes 26 on a lower surface thereof. The electrodes 25 and 26 are connected to each other through interlayer connection electrodes (via-hole conductors) 27 provided in the sub-substrate 20. Both ends of the inductor 21 are connected through electrodes (not shown) on the upper surface of the sub-substrate 20 to functional elements, such as capacitors (not shown), for example, included in the main substrate 10, or connected through the internal electrodes (not shown) of the main substrate 10 and the electrodes 11 to the IC chip 50 or the chip components 52.

The electrodes 25 are preferably connected by solder, for example, to the second connection electrodes 12b on the lower surface 10a of the main substrate 10. The connection electrodes 12b are preferably connected to the functional elements, such as capacitors (not shown), for example, included in the main substrate 10, or connected through the internal electrodes (not shown) of the main substrate 10 and the electrodes 11 to the IC chip 50 or the chip components 52. The connection electrodes 12b may be connected to ground electrodes (not shown) included in the main substrate 10.

The sealing layers 30 and 55 are preferably made of resin, such as epoxy resin, for example. The lower surface of the sealing layer 30 defines the mount surface 30a arranged to be mounted on the mount board 100. The first terminal electrodes 41a and the second terminal electrodes 41b are provided on the mount surface 30a. The first terminal electrodes 41a are connected through interlayer connection electrodes 35a in the sealing layer 30 to the first connection electrodes 12a. The connection electrodes 12a are connected to the ground electrodes (not shown) included in the main substrate 10. The terminal electrodes 41b on the mount surface 30a are connected through interlayer connection electrodes 35b in the sealing layer 30 to the electrodes 26 on the lower surface of the sub-substrate 20. The interlayer connection electrodes 35a and 35b in the sealing layer 30 are preferably defined by via-hole conductors, for example.

The composite module 1A configured as described above is preferably connected by solder, for example, to lands 101 on a surface of the mount board 100. The mount surface 30a is provided with various terminal electrodes as well as the terminal electrodes 41a and 41b illustrated in FIG. 1. The surface of the mount board 100 is provided with various lands as well as the lands 101.

In the composite module 1A, the mount surface 30a is preferably provided with not only the first terminal electrodes 41a drawn directly from the main substrate 10 (connection electrodes 12a), but also the second terminal electrodes 41b drawn directly from the sub-substrate 20 (electrodes 26) on one principal surface (lower surface 10a) of the main substrate 10. Therefore, even if an increase in the number of components mounted on the main substrate 10 causes an increase in the required number of terminal electrodes to be provided on the mount surface 30a, the components mounted on the main substrate can be connected to the lands 101 on the mount board 100 through the electrodes 25 and 26 using the second terminal electrodes 41b directly below the electrodes 25 and 26. Thus, it is possible to increase the number of terminal electrodes required to be connected to the mount board 100 without increasing the size of the main substrate 10.

If a magnetic substrate or a dielectric substrate is used as the sub-substrate 20 and ground lines are provided inside the sub-substrate 20, noise tends to be superimposed on the ground lines. As a result, ideal ground lines cannot be provided due to the effect of stray capacitance and stray inductance. In the first preferred embodiment, the first connection electrodes 12a, the first terminal electrodes 41a, and the interlayer connection electrodes 35a are preferably used as ground lines. Since these ground lines are arranged to minimize the distance to the mount board 100 and are not arranged inside the sub-substrate 20, unwanted capacitance components and inductance components are effectively prevented.

The inductor 21 in the sub-substrate 20 mounted on one principal surface of the main substrate 10 is preferably a built-in coil-shaped inductor, for example, not a chip component. Therefore, it is possible to increase the area through which magnetic fluxes pass, and to achieve a large inductance value. Moreover, if the sub-substrate 20 has magnetic permeability preferably than that of the main substrate 10, the inductor 21 can achieve a greater inductance value.

Second Preferred Embodiment

Figure 2:
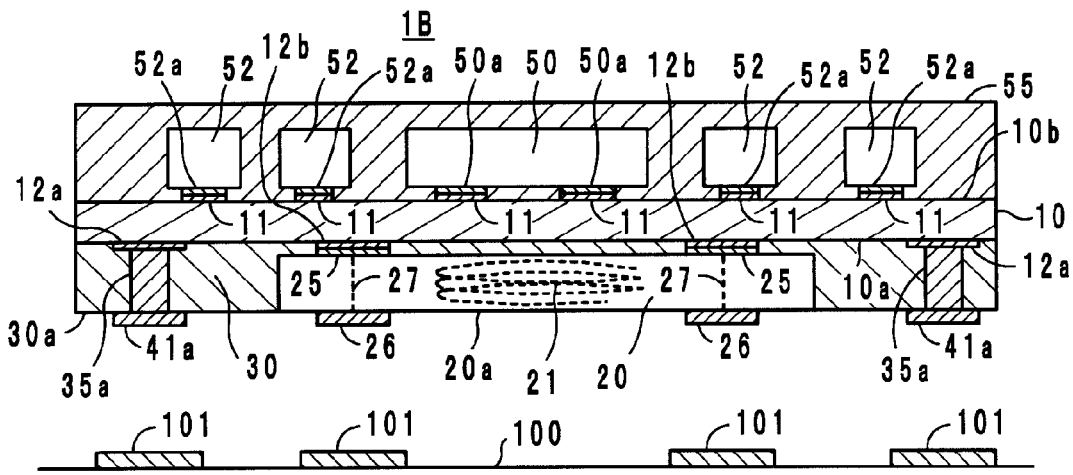
FIG. 2 is a cross-sectional view of a composite module according to a second preferred embodiment of the present invention.

FIG. 2 illustrates a composite module 1B according to a second preferred embodiment of the present invention. In the composite module 1B, the sealing layer 30 preferably covers the lower surface 10a of the main substrate 10 such that the sealing layer 30 is flush with one principal surface (lower surface 20a) of the sub-substrate 20. In other words, the mount surface 30a includes the lower surface of the sealing layer 30 and the lower surface 20a of the sub-substrate 20. Therefore, the electrodes on the lower surface 20a of the sub-substrate 20 define terminal electrodes arranged to be connected to the lands 101 on the mount board 100.

The remaining configuration and functional effects of the second preferred embodiment are substantially the same as those of the first preferred embodiment.

First Modification of Sub-Substrate

Figure 3:
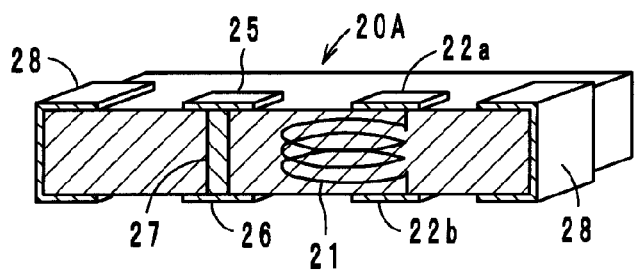
FIG. 3 is a perspective view illustrating a first modification of a sub-substrate according to a preferred embodiment of the present invention.

FIG. 3 illustrates a first modification of the sub-substrate according to a preferred embodiment of the present invention. In addition to the via-hole conductor 27 and the electrodes 25 and 26 described in the first preferred embodiment, a sub-substrate 20A is preferably also provided with an electrode 22a and an electrode 22b connected to first and second ends, respectively, of the built-in inductor 21, and electrodes 28. The electrodes 22a and 22b are disposed on the upper and lower surfaces, respectively, of the sub-substrate 20A. The electrodes 28 preferably extend from the upper surface through an end surface to the lower surface of the sub-substrate 20A.

The electrode 22a of the inductor 21 is preferably connected by solder, for example, to an electrode on the lower surface of the main substrate 10, while the electrode 22b is preferably connected through a via-hole conductor in the sealing layer 30 to a terminal electrode on the mount surface 30a. The electrodes 28 on the surface of the sub-substrate 20A are, for example, used as ground lines instead of the interlayer connection electrodes 35a (see FIG. 1 and FIG. 2) in the sealing layer 30 according to the first and second preferred embodiments.

In the first modification, the upper and lower surfaces of the sub-substrate 20A are preferably provided with the electrodes 22a and 22b that define an input electrode and an output electrode of the inductor 21, the electrodes 25 and 26 connected to the via-hole conductor 27, and the electrodes 28 on the surface of the sub-substrate 20A. Since these electrodes 22a, 22b, 25, 26, and 28 are provided on the sub-substrate 20A, no positional displacement occurs and mounting accuracy with respect to terminal electrodes is ensured. In particular, since the input and output electrodes 22a and 22b of the inductor 21 and the other electrodes 25, 26, and 28 are disposed on the sub-substrate 20A, no positional displacement occurs between the electrodes 22a and 22b of the inductor 21 and the other electrodes 25, 26, and 28. When the electrodes 26 and 28 on the sub-substrate 20A are connected to the second terminal electrodes 41b, and the via-hole conductor 27 and the electrodes 28 function as interlayer connection electrodes, the size of the main substrate 10 can be reduced.

When the sub-substrate 20A is used in the second preferred embodiment described above, the electrodes 22b and 28 may preferably be directly connected by solder, for example, to lands on the mount board 100.

Second Modification of Sub-Substrate

Figure 4:
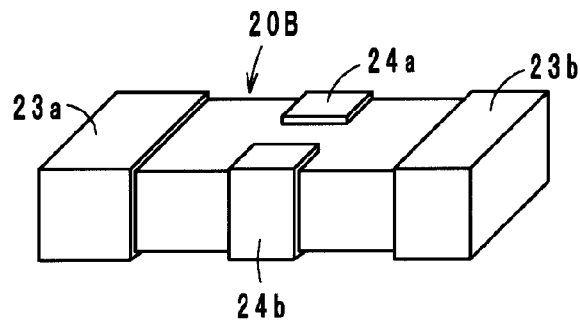
FIG. 4 is a perspective view illustrating a second modification of the sub-substrate according to a preferred embodiment of the present invention.

FIG. 4 illustrates a second modification of the sub-substrate according to a preferred embodiment of the present invention. A sub-substrate 20B preferably includes a built-in capacitor. The sub-substrate 20B is preferably provided with electrodes 23a and 23b at both ends thereof and electrodes 24a and 24b at a central portion thereof. The electrodes 23a and 23b preferably define input/output terminals of the capacitor. Preferably, the electrodes 23a and 23b are, for example, connected by solder to electrodes on the lower surface 10a of the main substrate 10. Preferably, the electrodes 24a and 24b are, for example, used as ground lines instead of the interlayer connection electrodes 35a (see FIG. 1 and FIG. 2) in the sealing layer 30.

When the sub-substrate 20B is used in the second preferred embodiment, the electrodes 23a, 23b, 24a, and 24b are preferably directly connected by solder, for example, to lands on the mount board 100.

Third Preferred Embodiment

A third preferred embodiment of the present invention is configured as a DC-DC down-converter mounted on a mount board of a mobile phone. Referring to an equivalent circuit shown in FIG. 5, a DC-DC converter 1C preferably includes an IC chip 50 which includes a switching element defined by a field-effect transistor. The DC-DC converter 1C includes an input terminal electrode Vin and an output terminal electrode Vout. A capacitor Cin on the input side is connected to a ground terminal electrode GND1, while an inductor Lout on the output side is connected through a capacitor Cout to a ground terminal electrode GND3. The IC chip 50 preferably includes terminal electrodes Vdd, Vcon, and Ven for power supply and a ground terminal electrode GND2, for example.

Figure 5:
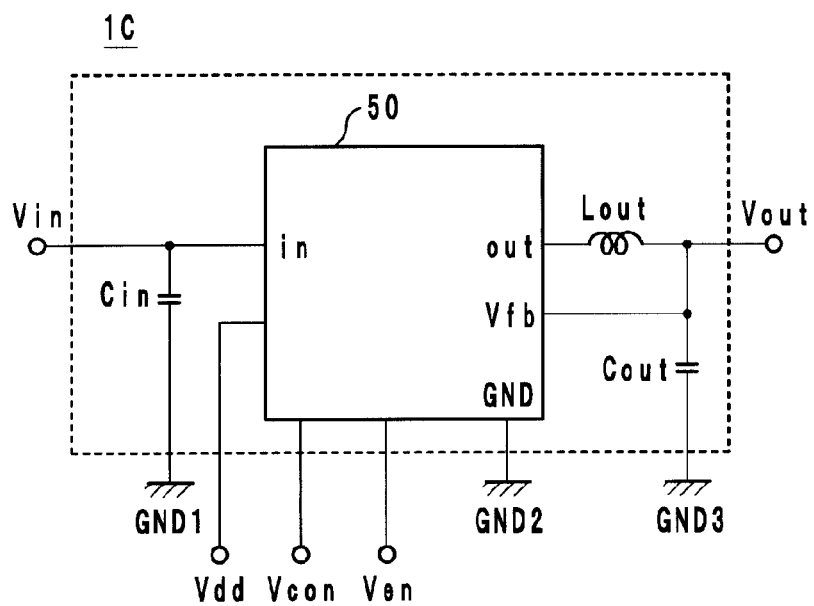
FIG. 5 is a block diagram illustrating a circuit configuration of a DC-DC converter according to a third preferred embodiment of the present invention.
Figure 6A:
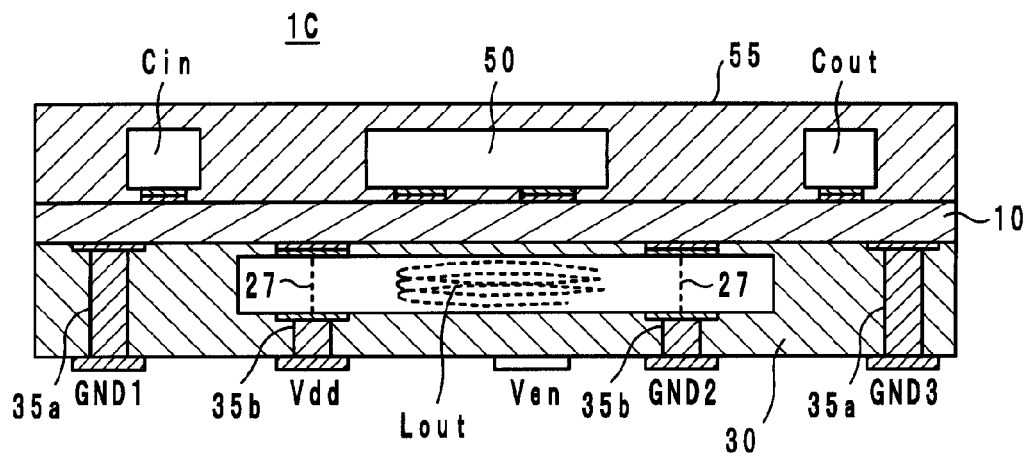
FIG. 6A is a cross-sectional view of the DC-DC converter third preferred embodiment of the present invention.
Figure 6B:
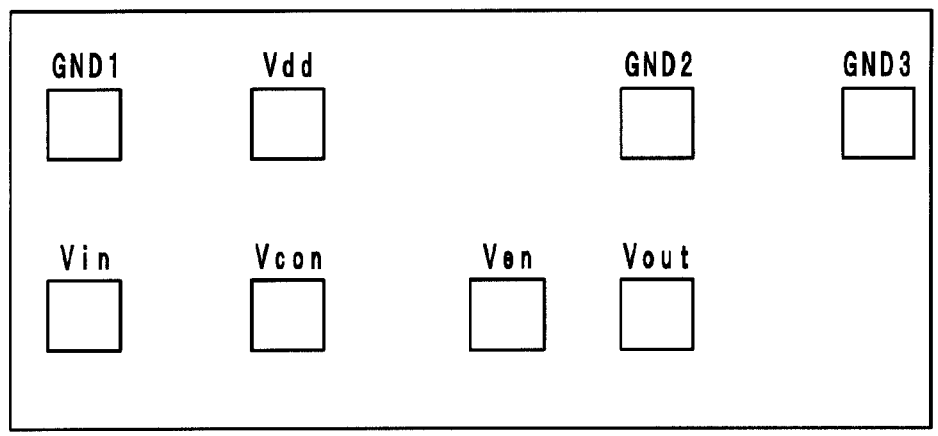
FIG. 6B is a bottom view of the DC-DC converter third preferred embodiment of the present invention.

The configuration of the DC-DC converter 1C is preferably substantially the same as that of the composite module 1A according to the first preferred embodiment. In FIG. 6, devices and electrodes corresponding to those illustrated in FIG. 5 are denoted by the same reference symbols as those in FIG. 5.

Specifically, the input terminal electrode Vin is connected through an interlayer connection electrode (not shown) in the sealing layer 30 and an internal electrode (not shown) of the main substrate 10 to the capacitor Cin and the IC chip 50. The ground terminal electrode GND1 is connected through the interlayer connection electrode 35a and an internal electrode (not shown) of the main substrate 10 to the capacitor Cin. The terminal electrode Vdd is connected through the interlayer connection electrodes 35b and 27 and an internal electrode (not shown) of the main substrate 10 to the IC chip 50. The terminal electrode Vdd, the terminal electrodes Vcon and Ven are connected through interlayer connection electrodes (not shown) in the sealing layer 30 and internal electrodes (not shown) of the main substrate 10 to the IC chip 50.

The ground terminal electrode GND2 is connected through the interlayer connection electrodes 35b and 27 and an internal electrode (not shown) of the main substrate 10 to the IC chip 50. The output terminal electrode Vout is connected through an interlayer connection electrode (not shown) in the sealing layer 30 to one end of the inductor Lout. The other end of the inductor Lout is connected through an external electrode (not shown) and an internal electrode (not shown) of the main substrate 10 to the IC chip 50. The ground terminal electrode GND3 is connected through the interlayer connection electrode 35a and an internal electrode (not shown) of the main substrate to the capacitor Cout. The capacitor Cout is connected through an internal electrode (not shown) of the main substrate 10 to the IC chip 50.

As described above, the DC-DC converter 1C preferably has substantially the same configuration and functional effects as those of the first preferred embodiment.

The composite module according to preferred embodiments of the present invention is not limited to the preferred embodiments described above, and can be variously modified within the gist of the present invention.

In particular, the main substrate enables mounting of various types of components including, for example, passive surface mount devices, such as capacitors, inductors, and resistors, and active surface mount devices, such as IC chips. Thus, it is possible to configure composite modules different from those described in the preferred embodiments described above.

As described above, preferred embodiments of the present invention are applicable to composite modules, such as DC-DC converters, and are particularly advantageous in that high-density mounting of components can be achieved without increasing the size of the composite modules.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A composite module comprising: a main substrate; a sub-substrate mounted on one principal surface of the main substrate; a sealing layer arranged on the one principal surface of the main substrate to at least partially cover and be in direct contact with the sub-substrate, the sealing layer defining a mount surface arranged to be mounted on a mount board; terminal electrodes disposed on the mount surface; and connection electrodes arranged on the one principal surface of the main substrate; wherein the terminal electrodes include at least one first terminal electrode drawn directly from the main substrate and at least one second terminal electrode drawn directly from the sub-substrate; the sub-substrate includes at least one first surface electrode arranged on a first principal surface of the sub-substrate and at least one second surface electrode arranged on a second principal surface of the sub-substrate; the connection electrodes include at least one first connection electrode electrically connected to the at least one first surface electrode; and the at least one second surface electrode is electrically connected to the at least one second terminal electrode; wherein the sub-substrate includes a built-in coil-shaped inductor; wherein the first and second principal surfaces of the sub-substrate are provided with at least one of electrodes connected to respective ends of the inductor, electrodes connected to each other through a via-hole conductor provided in the sub-substrate, or electrodes extending from the first principal surface of the sub-substrate through an end surface to the second principal surface of the sub-substrate.

2. The composite module according to claim 1, wherein the main substrate is a multilayer circuit board.

3. The composite module according to claim 1, wherein the sub-substrate is a magnetic substrate or a dielectric substrate having a dielectric constant greater than that of the main substrate.

4. The composite module according to claim 1, wherein the connection electrodes include at least one second connection electrode;
  the at least one first connection electrode is connected through an interlayer connection electrode to the at least one first terminal electrode; and
  the at least one second connection electrode is connected through an electrode provided in the sub-substrate to the at least one second terminal electrode.

5. The composite module according to claim 1, wherein
  the first and second principal surfaces of the sub-substrate are provided with at least one of electrodes connected to each other through a via-hole conductor provided in the sub-substrate or electrodes extending from the first principal surface of the sub-substrate through an end surface to the second principal surface of the sub-substrate; and
  the electrodes are connected to the second terminal electrodes.

6. The composite module according to claim 1, wherein
  the sealing layer is arranged to cover the second principal surface of the sub-substrate; and
  the at least one second terminal electrode is connected through at least one interlayer connection electrode provided in the sealing layer to the at least second surface electrode.

7. The composite module according to claim 1, wherein
  the sealing layer is arranged to cover the sub-substrate such that the sealing layer is flush with the second principal surface of the sub-substrate; and
  at least one electrode on the second principal surface of the sub-substrate defines the at least one second terminal electrode.

8. The composite module according to claim 1, wherein a passive surface mount device and/or an active surface mount device are/is mounted on another principal surface of the main substrate.

9. The composite module according to claim 4, wherein the interlayer connection electrode is a via-hole conductor provided in the sealing layer.

10. The composite module according to claim 4, wherein the interlayer connection electrode includes the at least one second surface electrode.

* * * * *